United States Patent
Murazaki (10) Patent No.: US 11,162,025 B2
(45) Date of Patent: Nov. 2, 2021

(54) BORON NITRIDE FLUORESCENT MATERIAL, AND METHOD FOR PRODUCING THE SAME

(71) Applicant: NICHIA CORPORATION, Anan (JP)

(72) Inventor: Yoshinori Murazaki, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 286 days.

(21) Appl. No.: 16/378,929

(22) Filed: Apr. 9, 2019

(65) Prior Publication Data
US 2019/0309222 A1 Oct. 10, 2019

(30) Foreign Application Priority Data

Apr. 10, 2018 (JP) .............................. JP2018-075395
Apr. 1, 2019 (JP) .............................. JP2019-069772

(51) Int. Cl.
*C09K 11/77* (2006.01)
*C09K 11/63* (2006.01)
(Continued)

(52) U.S. Cl.
CPC ...... *C09K 11/7759* (2013.01); *C09K 11/0883* (2013.01); *C09K 11/57* (2013.01); *C09K 11/63* (2013.01); *C09K 11/77* (2013.01); *C09K 11/7715* (2013.01); *C09K 11/7743* (2013.01); *F21K 9/64* (2016.08); *F21Y 2115/10* (2016.08); *F21Y 2115/30* (2016.08); *H01L 33/502* (2013.01); *H01L 2933/0041* (2013.01)

(58) Field of Classification Search
CPC ............ C09K 11/775957; C09K 11/77; C09K 11/7715; C09K 11/7743; C09K 11/63; C09K 11/0883; H01L 33/502; F21K 9/64; F21K 2115/10; F21K 2115/30
See application file for complete search history.

(56) References Cited

U.S. PATENT DOCUMENTS 4,409,193 A * 10/1983 Sato .................... C04B 35/5831
                                                                423/279
7,267,787 B2    9/2007 Dong et al.
(Continued)

FOREIGN PATENT DOCUMENTS

JP      2008509552 A    3/2008
JP      2017533306 A    11/2017

OTHER PUBLICATIONS

Li et al, "Design and research of a self-activated orange magnesium boron nitride with its application in w-LEDs", Dalton Trans., 2018, 47, pp. 15439-15447.*

(Continued)

*Primary Examiner* — C Melissa Koslow
(74) *Attorney, Agent, or Firm* — Hunton Andrews Kurth LLP (57) ABSTRACT

A boron nitride fluorescent material, having at least one light emission peak wavelength in a range of 480 nm or more and less than 650 nm as excited with light having a light emission peak wavelength in a range of 250 nm or more and 460 nm or less, and comprising: at least one element A selected from the group consisting of alkaline earth metal elements; nitrogen and boron; and optionally at least one element M1 selected from the group consisting of Tb, Sm, Pr, Ce, Mn, and Yb.

7 Claims, 4 Drawing Sheets

(51) Int. Cl.
*C09K 11/08* (2006.01)
*F21K 9/64* (2016.01)
*C09K 11/57* (2006.01)
*F21Y 115/10* (2016.01)
*F21Y 115/30* (2016.01)
*H01L 33/50* (2010.01)

(56) References Cited

U.S. PATENT DOCUMENTS

| | | |
|---|---|---|
| 7,887,719 B2 | 2/2011 | Dong et al. |
| 2006/0027781 A1 | 2/2006 | Dong et al. |
| 2008/0073616 A1 | 3/2008 | Dong et al. |
| 2016/0186054 A1* | 6/2016 | Kang ................. C09K 11/7728 252/301.4 R |
| 2017/0306223 A1* | 10/2017 | Petry ................. C09K 11/0877 |

OTHER PUBLICATIONS

Ding et al, "Self-activated Yellow Light Emitting Phosphors of a,b-Ca3B2N4 with Long Afterglow Properties", Inorganic Chemistry, 2016, 55, pp. 10990-10998, Oct. 25, 2016.*

* cited by examiner

BORON NITRIDE FLUORESCENT MATERIAL, AND METHOD FOR PRODUCING THE SAME

CROSS-REFERENCE TO RELATED PATENT APPLICATION

This application claims priority to Japanese Patent Application No. 2018-075395, filed on Apr. 10, 2018, and Japanese Patent Application No. 2019-069772, filed on Apr. 1, 2019, the entire disclosures of which are incorporated herein by references in their entirety.

BACKGROUND

Technical Field

The present invention relates to a boron nitride fluorescent material, and a method for producing the same. In this specification, the "fluorescent material" is used in the same meaning as a "fluorescent phosphor".

Description of Related Art

Various light emitting devices that emit white light, bulb color light, according to the principle of light color mixing by combining an excitation light source such as a light emitting diode (hereinafter also referred to as "LED") or a laser diode (hereinafter also referred to as "LD") with a fluorescent material have been developed. These light emitting devices are being utilized in a wide variety of fields including light emitting devices for lighting systems, automobiles, backlights for liquid crystal display devices, displays, illuminations, projectors.

As an example of such light emitting devices, Japanese Unexamined Patent Application Publication (Translation of PCT Application) No. 2008-509552 discloses a light emitting device capable of emitting while-based mixed-color light by combining an excitation light source that emits light in a wavelength range of 250 nm or more and 400 nm or less with a fluorescent material that absorbs at least a part of the light to emit light. As a fluorescent material to be used for such light emitting devices, for example, an orthosilicate fluorescent material that is represented by $M_2SiO_4:Eu^{2+}$ (wherein M represents at least one bivalent metal selected from the group consisting of Sr, Ca, Ba, Mg, Zn, and Cd) is known.

As for a fluorescent material to be used for such light emitting devices, there has been a demand for developing a fluorescent material capable of providing various light emission spectra on the purpose, capable of emitting light by excitation light having a wide wavelength range, and capable of satisfying demands of light emission characteristics and reliability.

Accordingly, an embodiment of the present disclosure has an object to provide a boron nitride fluorescent material having a possibility of satisfying such demands, a light emitting device using the same, and a method for producing the same.

SUMMARY

Measures for solving the aforementioned problem include the following embodiments.

A first embodiment of the present disclosure relates to a boron nitride fluorescent material, comprising: at least one element A selected from the group consisting of alkaline earth metal elements; nitrogen and boron; and optionally at least one element M1 selected from the group consisting of Tb, Sm, Pr, Ce, Mn, and Yb, wherein the boron nitride fluorescent material has at least one light emission peak wavelength in a range of 480 nm or more and less than 650 nm as excited with light having a light emission peak wavelength in a range of 250 nm or more and 460 nm or less.

A second embodiment of the present disclosure relates to a boron nitride fluorescent material, comprising: nitrogen, boron, and at least one element A selected from the group consisting of alkaline earth metal elements, wherein the boron nitride fluorescent material has at least one light emission peak wavelength in a range of 480 nm or more and less than 650 nm as excited with light having a light emission peak wavelength in a range of 250 nm or more and 460 nm or less.

A third embodiment of the present disclosure relates to a light emitting device comprising a boron nitride fluorescent material according to the present disclosure and an excitation light source.

A fourth embodiment of the present disclosure relates to a method for producing a boron nitride fluorescent material, comprising: preparing a mixture containing a hydride or a nitride containing at least one element A selected from the group consisting of alkaline earth metal elements, a boron nitride, and optionally a compound containing at least one element M1 selected from the group consisting of Tb, Sm, Pr, Ce, Mn, and Yb; and subjecting the mixture to a heat treatment under a pressure of 10 atmospheric pressures or less.

A fifth embodiment of the present disclosure relates to a method for producing a boron nitride fluorescent material, comprising: preparing a mixture containing a hydride or a nitride containing at least one element A selected from the group consisting of alkaline earth metal elements, a boron nitride, and subjecting the mixture to a heat treatment under a pressure of 10 atmospheric pressures or less.

In accordance with the embodiments of the present disclosure, a boron nitride fluorescent material capable of emitting light having various light emission spectra by excitation light having a relatively wide wavelength range, a light emitting device using the same, and a method for producing the same, can be provided.

DETAILED DESCRIPTION

Embodiments of the boron nitride fluorescent material, the light emitting device, and the method for producing the boron nitride fluorescent material according to the present invention are hereunder described. The embodiments shown below are exemplifications for exemplifying the technical idea of the present invention, and the present invention is not limited to the boron nitride fluorescent material, the light emitting device, and the method for producing the boron nitride fluorescent material mentioned below. Standards according to JIS Z8110 are applied to the relations between color names and chromaticity coordinates, the relations between wavelength ranges of light and color names of monochromatic lights.

Boron Nitride Fluorescent Material

A boron nitride fluorescent material according to the present disclosure may be a boron nitride fluorescent material having at least one light emission peak wavelength in a range of 480 nm or more and less than 650 nm as excited with light having a light emission peak wavelength in a range of 250 nm or more and 460 nm or less, and comprising: at least one element A selected from the group consisting of alkaline earth metal elements; nitrogen and boron; and optionally at least one element M1 selected from the group consisting of Tb, Sm, Pr, Ce, Mn, and Yb.

A boron nitride fluorescent material according to the present disclosure may be a boron nitride fluorescent material having at least one light emission peak wavelength in a range of 480 nm or more and less than 650 nm as excited with light having a light emission peak wavelength in a range of 250 nm or more and 460 nm or less, and comprising: at least one element A selected from the group consisting of alkaline earth metal elements, nitrogen and boron.

The boron nitride fluorescent material may contain a composition represented by the following formula (I).

$$A_3B_2N_4:M1_x \quad (I)$$

wherein A represents at least one element selected from the group consisting of alkaline earth metal elements, M1 represents at least one element selected from the group consisting of Tb, Sm, Pr, Ce, Mn, and Yb, and x is a number satisfying $0 \leq x \leq 0.10$.

The boron nitride fluorescent material may contain a composition represented by the following formula (II).

$$A_3B_2N_4 \quad (II)$$

wherein A represents at least one element selected from the group consisting of alkaline earth metal elements.

Examples of the light emitting element having a light emission peak wavelength in a wavelength range of near-ultraviolet region may include a semiconductor laser. A fluorescent material capable of converting the wavelength by excitation light emitted from the light emitting element having a light emission peak wavelength in a wavelength range of 250 nm or more and 460 nm or less including a near-ultraviolet region, is desired. The boron nitride fluorescent material according to the first embodiment of the present disclosure has a light emission peak wavelength in a region of green to orange color, that is, a range of 480 nm or more and less than 650 nm by excitation light emitted from a light emitting element having a light emission peak wavelength in a wavelength range of 250 nm or more and 460 nm or less. The excitation light emitted from the light emitting element has a light emission peak wavelength preferably in a wavelength range of 250 nm or more and 400 nm or less, more preferably in a wavelength range of 250 nm or more and 380 nm or less, even more preferably in a wavelength range of 250 nm or more and 370 nm or less.

The element A contained in the boron nitride fluorescent material is at least one element selected from the group consisting of alkaline earth metal elements. The element A is, from the viewpoints of light emission efficiency and reliability, preferably at least one element selected from the group consisting of Mg, Ca, Sr, and Ba, more preferably at least one element selected from the group consisting of Ca, Sr, and Ba, even more preferably at least one element selected from Ca and Ba, still more preferably Ca.

The boron nitride fluorescent material exhibits a light emission spectrum derived from at least one matrix light emission by the excitation light having a light emission peak wavelength in a range of 250 nm or more and 460 nm or less. The element M1 is an activating element contained in the matrix. Since the boron nitride fluorescent material is a fluorescent material exhibiting matrix light emission, the boron nitride fluorescent material can emit light even in the case of not containing the element M1 serving as an activating element. The boron nitride fluorescent material may not contain an activating element represented by the element M1. The boron nitride fluorescent material not containing the element M1 preferably contains the composition represented by the formula (II). The boron nitride fluorescent material may contain an activating element represented by the element M1. When the boron nitride fluorescent material contains the element M1 serving as an activating element, the boron nitride fluorescent material absorbs excitation light having a wide wavelength range to emit light having various light emission spectra caused by an activating element, and thus a color tone of the light emitted from the boron nitride fluorescent material can be changed. The element M1 is at least one element selected from the group consisting of Tb, Sm, Pr, Ce, Mn, and Yb, preferably at least one element selected from the group consisting of Tb, Sm, Pr, Ce, and Mn, more preferably at least one element selected from the group consisting of Tb, Sm, Pr, and Mn, even more preferably at least one element selected from the group consisting of Tb, Sm, and Pr. The element M1 may be at least one element selected from the group consisting of Tb, Sm and Yb, the element M1 may be at least one element selected from Tb and Yb. The element M1 excludes Eu. Europium may become a killer element to hinder the light emission of the nitride compound when the nitride compound is excited by the light having a light emission peak wavelength in a wavelength range in 250 nm or more and 460 nm or less. In the composition represented by the formula (I), the parameter x represents a molar ratio of the activating element M1 in the boron nitride fluorescent material, and the parameter x representing a molar ratio of the element M1 may be 0. In the composition represented by the formula (I), the parameter x is, from the viewpoints of color tone change depending on the type of the light source and reliability, in a range of 0 or more and 0.10 or less ($0 \leq x \leq 0.10$), preferably in a range of 0 or more and 0.08 or less ($0 \leq x \leq 0.08$), more preferably in a range of 0 or more and 0.05 or less ($0 \leq x \leq 0.05$), even more preferably in a range of 0 or more and 0.03 or less ($0 \leq x \leq 0.03$).

It is preferable that the boron nitride fluorescent material according to the present disclosure has at least one light emission peak wavelength in a range of 480 nm or more and less than 550 nm as excited with light having a light emission peak wavelength in a range of 250 nm or more and 460 nm or less, wherein the element A contains Ca. When the boron nitride fluorescent material contains the element M1, and the element M1 is at least one element selected from the group consisting of Tb, Sm, Pr, Ce, Mn, and Yb. In the boron nitride fluorescent material containing a composition represented by the formula (I), it is preferable that the element A contains Ca, the element M1 is at least one element selected from the group consisting of Tb, Sm, Pr, Ce, Mn, and Yb, and x is a number satisfying 0≤x≤0.03. The boron nitride fluorescent material may have two light emission peak wavelengths in a range of 480 nm or more and less than 550 nm as excited with light having a light emission peak wavelength in a range of 250 nm or more and 460 nm or less. The boron nitride fluorescent material may have a light emission peak wavelength caused by the element M1 in a range of exceeding 550 nm as excited with light having a light emission peak wavelength in a range of 250 nm or more and 460 nm or less. When the boron nitride fluorescent material has an emission peak wavelength in the range exceeding 550 nm, the emission intensity of the emission peak in the range exceeding 550 nm is lower than the emission intensity of the emission peak in the range of 480 nm or more and less than 550 nm.

Light Emitting Device

The light emitting device according to the present disclosure comprises the boron nitride fluorescent material according to the present disclosure and an excitation light source. The excitation light source is preferably a light emitting diode (LED) or a semiconductor laser (LD). Examples of the light emitting diode (LED) may include a nitride-based semiconductor ($In_XAl_YGa_{1-X-Y}N$, X≥0, Y≥0, X+Y≤1). Using the light emitting diode using a nitride-based semiconductor as an excitation light source enables a high efficiency stable light emitting device that has high linearity of output relative to input and is resistant to mechanical shock to be obtained. Examples of the semiconductor laser may include an Nd:YAG laser, a KrF excimer laser, an ArF excimer laser. The light emitting device combining the boron nitride fluorescent material and the LED can be utilized in the fields including light emitting devices for lighting systems, standard light sources. The light emitting device combining the boron nitride fluorescent material and the LD can be utilized in the fields including light emitting devices for lighting systems, projectors.

Method for Producing Boron Nitride Fluorescent Material

A method for producing a boron nitride fluorescent material according to the present disclosure may comprise: preparing a mixture containing a hydride or a nitride containing at least one element A selected from the group consisting of alkaline earth metal elements, a boron nitride, and optionally a compound containing at least one element M1 selected from the group consisting of Tb, Sm, Pr, Ce, Mn, and Yb; and subjecting the mixture to a heat treatment under a pressure of 10 atmospheric pressures or less. The heat treatment may be carried out under a pressure in a range of 1 atmospheric pressure or more and 10 atmospheric pressures or less. As the compound containing the element M1, the element M1 may be at least one element selected from the group consisting of Tb, Sm and Yb. The element M1 may be at least one element selected from Tb and Yb.

A method for producing a boron nitride fluorescent material according to the present disclosure may comprise: preparing a mixture containing a hydride or a nitride containing at least one element A selected from the group consisting of alkaline earth metal elements, and a boron nitride, and subjecting the mixture to a heat treatment under a pressure of 10 atmospheric pressures or less. The heat treatment may be carried out under a pressure in a range of 1 atmospheric pressure or more and 10 atmospheric pressures or less.

In accordance with the production method according to the present disclosure, the mixture may be prepared using a hydride or a nitride containing at least one element A selected from the group consisting of alkaline earth metal elements, a boron nitride, and optionally a compound containing at least one element M1 selected from the group consisting of Tb, Sm, Pr, Ce, Mn, and Yb as raw materials. The mixture may not contain a compound containing the element M1. In accordance with the production method according to the present disclosure, the mixture may be subjected to a heat treatment under a pressure of 10 atmospheric pressures or less (1.0 MPa or less), so that a boron nitride fluorescent material having at least one light emission peak wavelength in a range of 480 nm or more and less than 650 nm as excited with light having a light emission peak wavelength in a range of 250 nm or more and 460 nm or less, can be produced. In accordance with the production method, a boron nitride fluorescent material capable of emitting matrix light emission as excited with light having a light emission peak wavelength in a range of 250 nm or more and 460 nm or less, can be obtained without performing a heat treatment under a high pressure of more than 10 atmospheric pressures. The pressure in the heat treatment may be chosen depending on the temperature in the heat treatment, and is preferably 8 atmospheric pressures or less (0.8 MPa or less), more preferably 5 atmospheric pressures or less (0.5 MPa or less). The lower limit of the pressure in the heat treatment is not particularly limited, but is preferably 0.1 atmospheric pressures or more (0.01 MPa or more) or 1 atmospheric pressure or more.

Examples of the hydride containing at least one element A selected from the group consisting of alkaline earth metal elements may include $MgH_2$, $CaH_2$, $SrH_2$, and $BaH_2$. Examples of the nitride containing at least one element A selected from the group consisting of alkaline earth metal elements may include $Mg_3N_2$, $Ca_3N_2$, $Sr_3N_2$, SrN, and $Ba_3N_2$. As a raw material in the production method according to the third embodiment of the present disclosure, it is preferable to use the hydride containing the element A from the viewpoints of easy availability and relatively high reactivity.

Examples of the compound containing at least one element M1 selected from the group consisting of Tb, Sm, Pr, Ce, Mn, and Yb may include an oxide, a chloride, a fluoride, a nitride, each containing the element M1. From the viewpoints of easy availability and easy handleability, it is preferable to use the oxide or the nitride containing the element M1, as necessary. Specific examples of the compound containing the element M1 may include $Tb_4O_7$, $TbF_3$, $Sm_2O_3$, SmN, $SmF_3$, $Pr_6O_{11}$, PrN, $PrF_3$, $Ce_2O_3$, $CeO_2$, $CeF_3$, MnO, $Mn_2O_3$, $MnO_2$, $Yb_2O_3$, YbN, and $YbF_3$.

The atmosphere in the heat treatment is preferably an inert atmosphere or a reducing atmosphere in order to obtain a boron nitride fluorescent material having less crystal defect. Examples of the inert atmosphere may include an atmosphere containing at least one rare gas selected from the group consisting of helium, neon, and argon, and a nitrogen gas atmosphere. The inert atmosphere means an atmosphere containing helium, neon, argon and nitrogen as main components in the atmosphere. The inert atmosphere may inevitably contain oxygen as an impurity. In the present specification, when an oxygen concentration contained in the atmosphere is 15% by volume or less, the atmosphere is referred to as the inert atmosphere. The oxygen concentration in the inert atmosphere is preferably 10% by volume or less, more preferably 5% by volume or less, even more preferably 1% by volume or less. Examples of the reducing atmosphere may include a rare gas atmosphere containing hydrogen, and a nitrogen gas atmosphere containing hydrogen. The reducing atmosphere is an atmosphere containing hydrogen gas and one rare gas or hydrogen gas and a nitrogen gas as main components in the atmosphere.

The temperature in the heat treatment is preferably in a range of 1,200° C. or more and 1,600° C. or less. The temperature in the heat treatment is more preferably in a range of 1,250° C. or more and 1,550° C. or less, even more preferably in a range of 1,300° C. or more and 1,500° C. or less. When the temperature in the heat treatment falls within a range of 1,200° C. or more and 1,600° C. or less, a boron nitride fluorescent material having at least one light emission peak wavelength in a range of 480 nm or more and less than 650 nm as excited with light having a light emission peak wavelength in a range of 250 nm or more and 460 nm or less, which contains a composition represented by the formula (I), can be obtained.

By the production method according to the present disclosure, a boron nitride fluorescent material having at least one light emission peak wavelength in a range of 480 nm or more and less than 650 nm as excited with light having a light emission peak wavelength in a range of 250 nm or more and 460 nm or less, which contains a composition represented by the following formula (I), can be obtained.

$$A_3B_2N_4:M1_x \quad (I)$$

wherein A represents at least one element selected from the group consisting of alkaline earth metal elements, M1 represents at least one element selected from the group consisting of Tb, Sm, Pr, Ce, Mn, and Yb, and x is a number satisfying 0≤x≤0.10.

By the production method according to the present disclosure, a boron nitride fluorescent material having at least one light emission peak wavelength in a range of 480 nm or more and less than 650 nm as excited with light having a light emission peak wavelength in a range of 250 nm or more and 460 nm or less, which contains a composition represented by the following formula (II), can be obtained.

$$A_3B_2N_4 \quad (II)$$

wherein A represents at least one element selected from the group consisting of alkaline earth metal elements.

EXAMPLES

The present invention is hereunder specifically described by reference to the following Examples. The present invention is not limited to these Examples.

Example 1

12.6 g of calcium hydride ($CaH_2$) and 5.0 g of boron nitride (BN) were weighed and mixed for 20 minutes by using an agate mortar with an agate pestle, to thereby obtain a mixture. The mixture was subjected to a heat treatment at 1,350° C. for 10 hours in a nitrogen gas atmosphere of 1 atmospheric pressure (0.10 MPa). The resultant heat-treated product was ground to obtain a boron nitride compound represented by $Ca_3B_2N_4$.

Example 2

12.6 g of calcium hydride ($CaH_2$), 5.0 g of boron nitride (BN), and 0.2 g of terbium oxide ($Tb_4O_7$) were weighed and mixed for 20 minutes by using an agate mortar with an agate pestle, to thereby obtain a mixture. The mixture was subjected to a heat treatment at 1,350° C. for 10 hours in a nitrogen gas atmosphere of 1 atmospheric pressure (0.10 MPa). The resultant heat-treated product was ground to obtain a boron nitride compound represented by $Ca_3B_2N_4$:Tb.

Example 3

12.6 g of calcium hydride ($CaH_2$), 5.0 g of boron nitride (BN), and 0.2 g of samarium oxide ($Sm_2O_3$) were weighed and mixed for 20 minutes by using an agate mortar with an agate pestle, to thereby obtain a mixture. The mixture was subjected to a heat treatment at 1,350° C. for 10 hours in a nitrogen gas atmosphere of 1 atmospheric pressure (0.10 MPa). The resultant heat-treated product was ground to obtain a boron nitride compound represented by $Ca_3B_2N_4$:Sm.

Example 4

12.6 g of calcium hydride ($CaH_2$), 5.0 g of boron nitride (BN), and 0.2 g of praseodymium oxide ($Pr_6O_{11}$) were weighed and mixed for 20 minutes by using an agate mortar with an agate pestle, to thereby obtain a mixture. The mixture was subjected to a heat treatment at 1,350° C. for 10 hours in a nitrogen gas atmosphere of 1 atmospheric pressure (0.10 MPa). The resultant heat-treated product was ground to obtain a boron nitride compound represented by $Ca_3B_2N_4$:Pr.

Example 5

20.9 g of barium hydride ($BaH_2$) and 2.5 g of boron nitride (BN) were weighed and mixed for 20 minutes by using an agate mortar with an agate pestle, to thereby obtain a mixture. The mixture was subjected to a heat treatment at 1,350° C. for 10 hours in a nitrogen gas atmosphere of 1 atmospheric pressure (0.10 MPa). The resultant heat-treated product was ground to obtain a boron nitride compound represented by $Ba_3B_2N_4$.

Example 6

13.4 g of strontium hydride ($SrH_2$) and 2.5 g of boron nitride (BN) were weighed and mixed for 20 minutes by using an agate mortar with an agate pestle, to thereby obtain a mixture. The mixture was subjected to a heat treatment at 1,350° C. for 10 hours in a nitrogen gas atmosphere of 1 atmospheric pressure (0.10 MPa). The resultant heat-treated product was ground to obtain a boron nitride compound represented by $Sr_3B_2N_4$.

Comparative Example 1

12.6 g of calcium hydride ($CaH_2$), 5.0 g of boron nitride (BN), and 0.2 g of europium oxide ($Eu_2O_3$) were weighed and mixed for 20 minutes by using an agate mortar with an agate pestle, to thereby obtain a mixture. The mixture was subjected to a heat treatment at 1,350° C. for 10 hours in a nitrogen gas atmosphere of 1 atmospheric pressure (0.10 MPa). The resultant heat-treated product was ground to obtain a boron nitride compound.

Comparative Example 2

A boron nitride compound was obtained in the same manner as in Comparative Example 1 except that the heat treatment temperature was set at 1,250° C.

Comparative Example 3

A boron nitride compound was obtained in the same manner as in Comparative Example 1 except that the heat treatment temperature was set at 1,450° C.

Comparative Example 4

A boron nitride compound was obtained in the same manner as in Comparative Example 1 except that 20.9 g of barium hydride ($BaH_2$) and 2.5 g of boron nitride (BN) were used instead of 12.6 g of calcium hydride ($CaH_2$) and 5.0 g of boron nitride (BN).

Comparative Example 5

A boron nitride compound was obtained in the same manner as in Comparative Example 1 except that 13.4 g of strontium hydride ($SrH_2$) and 2.5 g of boron nitride (BN) were used instead of 12.6 g of calcium hydride ($CaH_2$) and 5.0 g of boron nitride (BN).

Comparative Example 6

A boron nitride compound was obtained in the same manner as in Comparative Example 1 except that 0.2 g of europium nitride (EuN) was used instead of 0.2 g of europium oxide ($Eu_2O_3$).

X-Ray Diffraction Spectrum

The X-ray diffraction (XRD) spectrum of each of the resultant boron nitride compounds was measured. The measurement was performed using a multipurpose X-ray diffraction system (product name: Ultima IV, manufactured by Rigaku Corporation) and CuKα rays. The presence or absence of formation of each alkaline earth metal boron nitride compound was confirmed from the obtained XRD pattern. As for each of Examples 1 to 4, the crystal of the composition represented by $Ca_3B_2N_4$ was formed. As for Example 5 and Comparative Example 4, the crystal of the composition represented by $Ba_3B_2N_4$ was formed. As for Example 6 and Comparative Example 5, the crystal of the composition represented by $Sr_3B_2N_4$ was formed. As for each of Comparative Examples 1 to 3 and 6, the crystal of the composition represented by $Ca_3B_2N_4$ was formed. The composition of each of Examples is shown in Table 1.

Light Emission Characteristics

The light emission characteristics of each of the resultant boron nitride compounds were measured. The light emission characteristics were measured at a light emission peak wavelength of excitation light of 365 nm using a fluorospectrophotometer (product name: QE-2000, manufactured by Otsuka Electronics Co., Ltd.). These light emission spectra are shown in FIGS. 1 to 6. Here, the light emission intensity at the light emission peak wavelength in Example 1 was the highest in Examples. In order to easily compare the shapes of the light emission spectra of the boron nitride compounds in Examples, the maximum light emission intensity in each of the light emission spectra was set to 100%. In addition, the light emission peak wavelength and the full width at half maximum in each of the light emission spectra were determined. The full width at half maximum (FWHM) indicates a wavelength width of the light emission peak showing a value of 50% of the maximum light emission peak in each of the light emission spectra. The results are shown in Table 1.

Measurement of Excitation Spectrum

With respect to each of the boron nitride compounds in Examples 4 to 6, the excitation spectra at the excitation wavelengths of 515 nm in Example 4, 595 nm in Example 5, and 610 nm in Example 6 were measured at 25° C.±5° C. (room temperature) in a range of 220 nm or more and 520 nm or less, using a fluorospectrophotometer (product name: F-4500, manufactured by Hitachi High-Technologies Corporation). The relative intensity (%) in each of the wavelengths, which was determined when the maximum intensity of the excitation spectrum in each of Examples 4 to 6 was taken as 100%, was shown in FIG. 7 as an excitation spectrum.

Reliability Evaluation by Temperature Characteristics: Relative Light Emission Energy (%)

Figure 8:
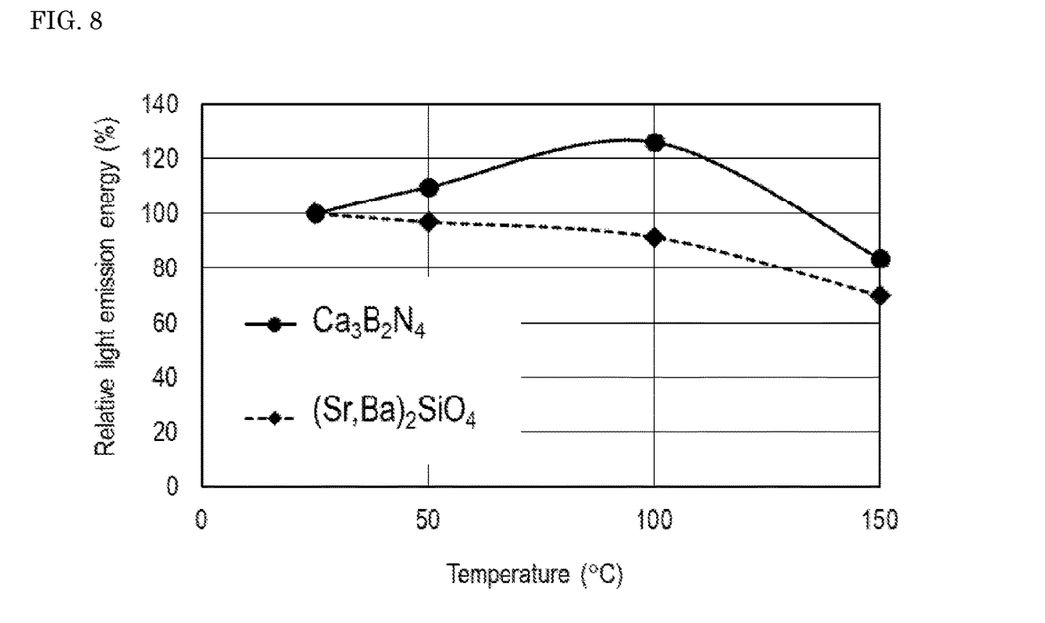
FIG. 8 is a graph showing relative light emission energies (%) relative to temperatures in a range of 25° C. (room temperature) to 150° C., of a boron nitride fluorescent material according to Example 1 and an orthosilicate-based fluorescent material as Reference Example.

With respect to the boron nitride compound containing a composition represented by $Ca_3B_2N_4$ in Example 1 and an orthosilicate fluorescent material containing a composition represented by $(Sr,Ba)_2SiO_4:Eu^{2+}$ as Reference Example, each light emission spectrum as excited with light emitted from the excitation light source having a light emission peak wavelength of 365 nm was measured in a temperature range of 25° C. (room temperature) to 150° C., using a fluorospectrophotometer (product name: QE-2000, manufactured by Otsuka Electronics Co., Ltd.). The relative energy value of the light emission spectrum (relative light emission energy (%)) of the fluorescent material in each of Example and Reference Example was determined in each temperature, when the energy value of the light emission spectrum measured at 25° C. in each of Example 1 and Reference Example was taken as 100%. Here, the energy value is a relative integrated value in a wavelength range of 480 nm or more and 650 nm or less in the light emission spectrum determined in each temperature. FIG. 8 is a graph showing the relative light emission energies (%) relative to temperatures in a range of 25° C. (room temperature) to 150° C., of the boron nitride compound according to Example 1 and the orthosilicate fluorescent material as Reference Example.

TABLE 1

| | Composition | Light Emission Peak Wavelength (nm) | | | Full Width at Half Maximum (nm) |
|---|---|---|---|---|---|
| Example 1 | $Ca_3B_2N_4$ | 515 | — | — | 110 |
| Example 2 | $Ca_3B_2N_4$:Tb | 489 | 545 | — | 110 |
| Example 3 | $Ca_3B_2N_4$:Sm | 515 | 607 | 651 | 110 |
| Example 4 | $Ca_3B_2N_4$:Pr | 515 | 610 | 637 | 110 |
| Example 5 | $Ba_3B_2N_4$ | 600 | — | — | 140 |
| Example 6 | $Sr_3B_2N_4$ | 610 | — | — | 130 |

Figure 1:
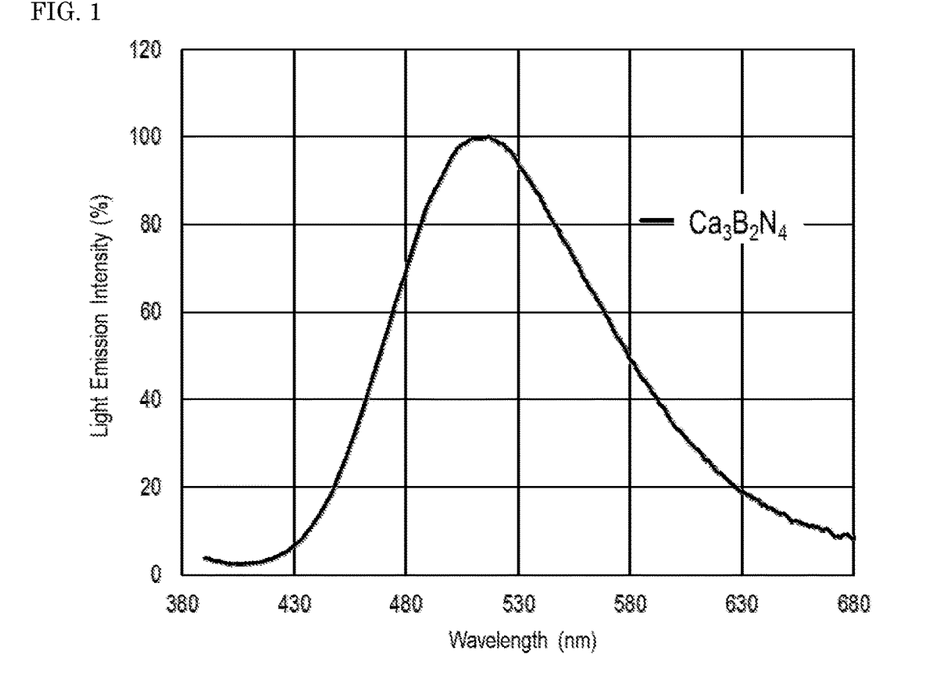
FIG. 1 is a graph showing a light emission spectrum of a boron nitride fluorescent material according to Example 1.

As shown in Table 1 and FIG. 1, the boron nitride compound represented by $Ca_3B_2N_4$ in Example 1 was a boron nitride fluorescent material having a light emission peak derived from the matrix light emission of which the light emission peak wavelength was 515 nm.

Figure 2:
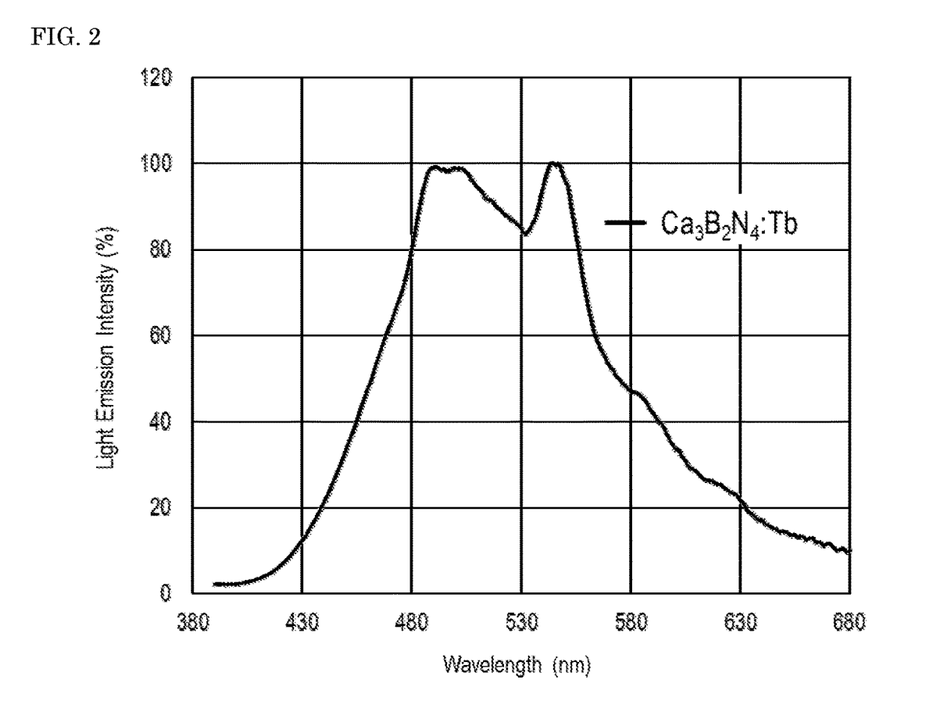
FIG. 2 is a graph showing a light emission spectrum of a boron nitride fluorescent material according to Example 2.

As shown in Table 1 and FIG. 2, the boron nitride compound represented by $Ca_3B_2N_4$:Tb in Example 2 was a boron nitride fluorescent material having a first light emission peak derived from the matrix light emission of which the light emission peak wavelength was 489 nm, and a second light emission peak derived from Tb of which the light emission peak wavelength was 545 nm.

Figure 3:
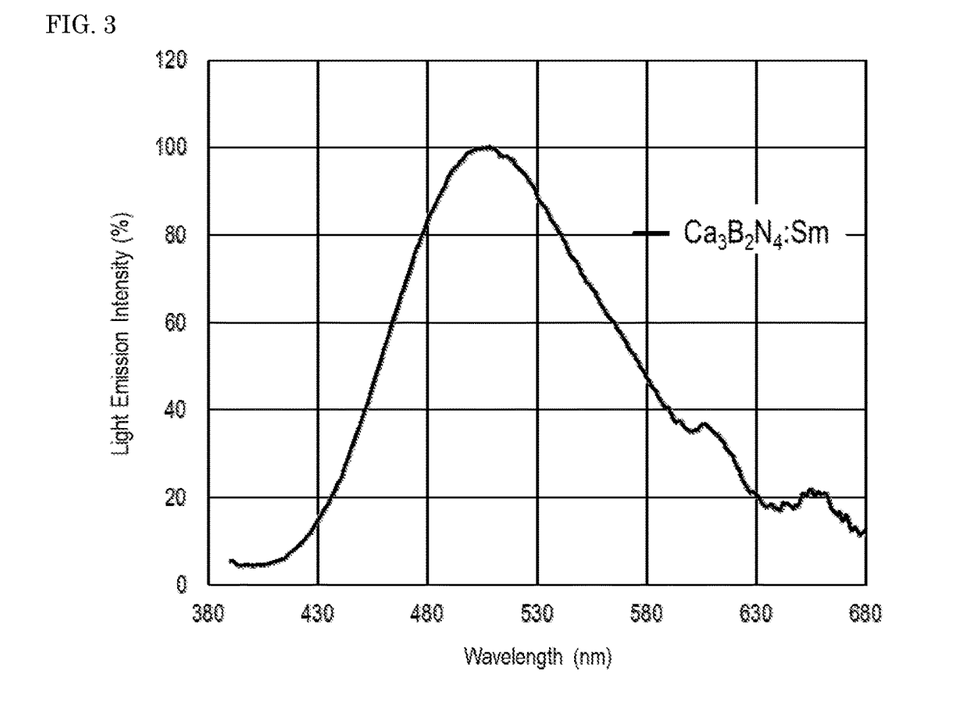
FIG. 3 is a graph showing a light emission spectrum of a boron nitride fluorescent material according to Example 3.

As shown in Table 1 and FIG. 3, the boron nitride compound represented by $Ca_3B_2N_4$:Sm in Example 3 was a boron nitride fluorescent material having a first light emission peak derived from the matrix light emission of which the light emission peak wavelength was 515 nm, and two light emission peaks derived from Sm, that is, a second light emission peak of which the light emission peak wavelength was 607 nm and a third light emission peak of which the light emission peak wavelength was 651 nm. The second light emission peak and the third light emission peak of the boron nitride fluorescent material of Example 3 have lower emission intensity than the first light emission peak.

Figure 4:
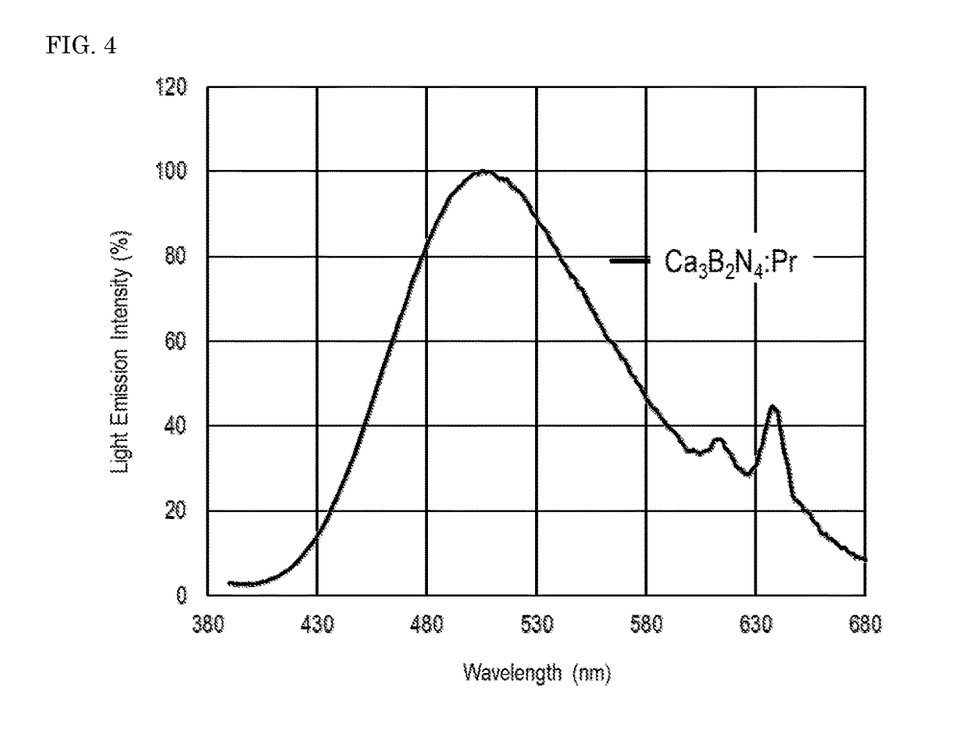
FIG. 4 is a graph showing a light emission spectrum of a boron nitride fluorescent material according to Example 4.

As shown in Table 1 and FIG. 4, the boron nitride compound represented by $Ca_3B_2N_4$:Pr in Example 4 was a boron nitride fluorescent material having a first light emission peak derived from the matrix light emission of which the light emission peak wavelength was 515 nm, and two light emission peaks derived from Pr, that is, a second light emission peak of which the light emission peak wavelength was 610 nm and a third light emission peak of which the light emission peak wavelength was 637 nm. The second light emission peak and the third light emission peak of the boron nitride fluorescent material of Example 4 have lower emission intensity than the first light emission peak.

Figure 5:
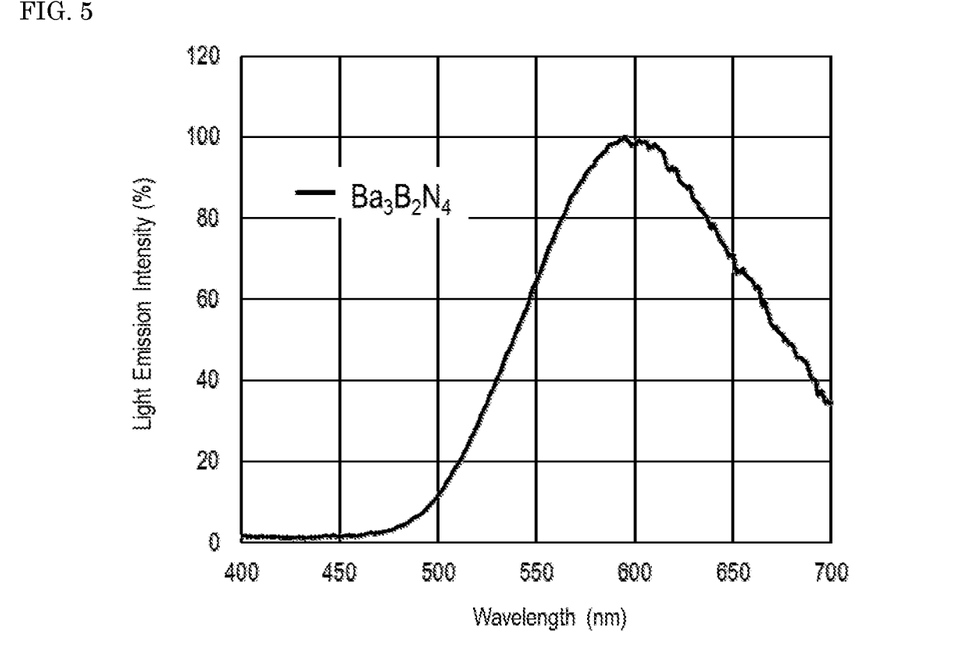
FIG. 5 is a graph showing a light emission spectrum of a boron nitride fluorescent material according to Example 5.

As shown in Table 1 and FIG. 5, the boron nitride compound represented by $Ba_3B_2N_4$ in Example 5 was a boron nitride fluorescent material having a light emission peak derived from the matrix light emission of which the light emission peak wavelength was 600 nm.

Figure 6:
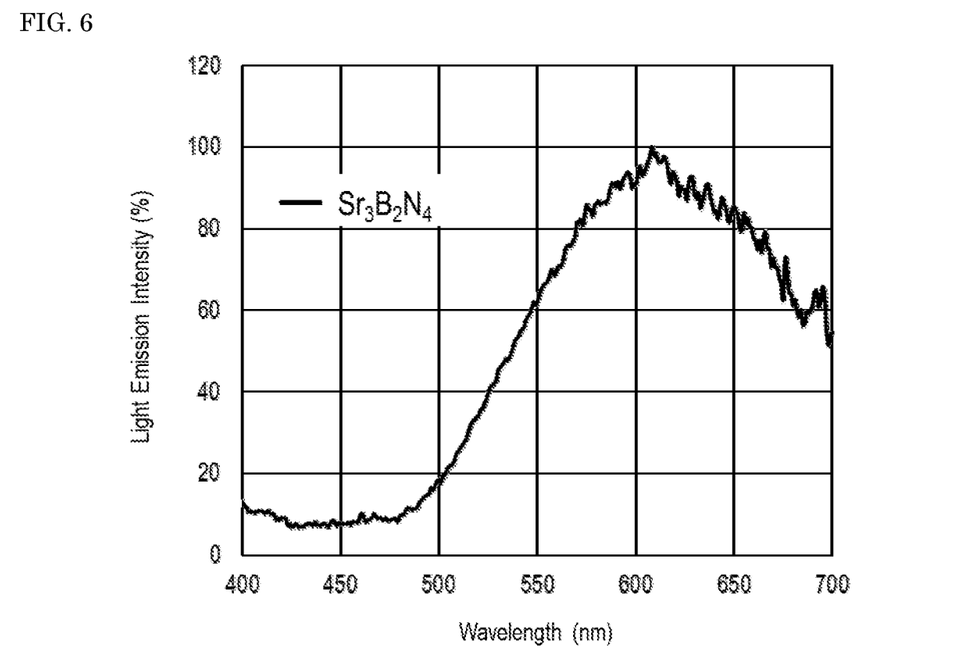
FIG. 6 is a graph showing a light emission spectrum of a boron nitride fluorescent material according to Example 6.

As shown in Table 1 and FIG. 6, the boron nitride compound represented by $Sr_3B_2N_4$ in Example 6 was a boron nitride fluorescent material having a light emission peak derived from the matrix light emission of which the light emission peak wavelength was 610 nm.

The boron nitride compound containing Eu according to each of Comparative Examples 1 to 6 did not emit light. It could be considered that europium became a killer element to hinder the light emission of the boron nitride compound represented by $Ca_3B_2N_4$, $Ba_3B_2N_4$ or $Sr_3B_2N_4$.

Figure 7:
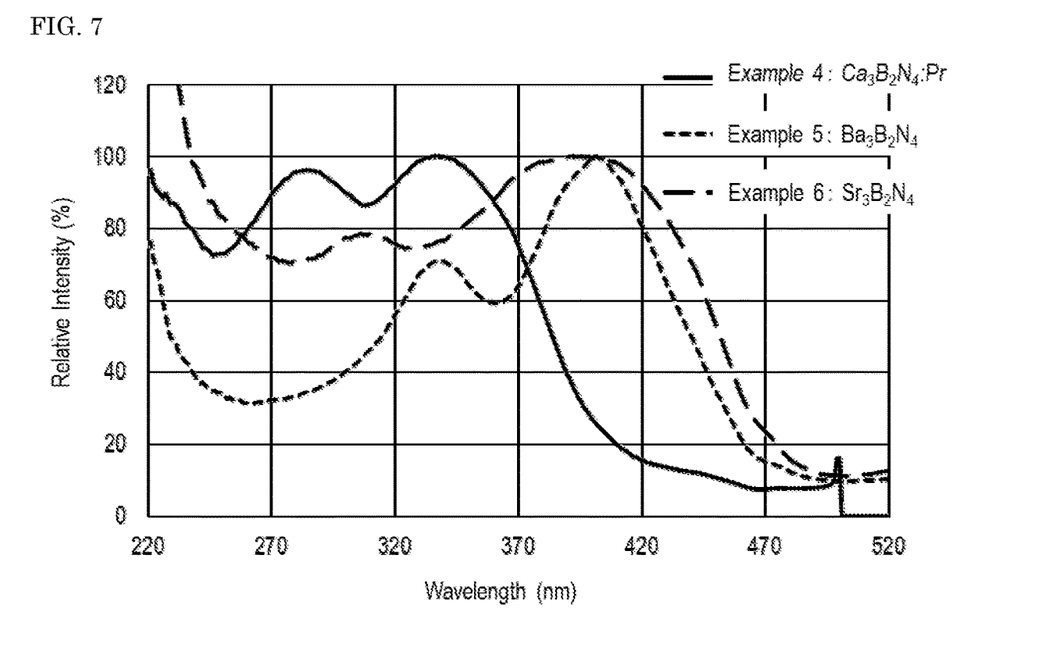
FIG. 7 is a graph showing excitation spectra of boron nitride fluorescent materials according to Examples 4 to 6.

As shown in FIG. 7, as for the boron nitride fluorescent material according to Example 4, the relative intensity in a wavelength range of 320 nm or more and 370 nm or less was the highest in the excitation spectrum. As for each of the boron nitride fluorescent materials according to Examples 5 and 6, the relative intensity in a wavelength range of 370 nm or more and 420 nm or less was the highest in the excitation spectrum. FIG. 7 indicates that various boron nitride fluorescent materials having different excitation spectra can be obtained by selecting an element to be contained in the composition of the boron nitride fluorescent material. In other words, by selecting the light emission peak wavelength of the excitation light source and the element contained in the composition of the boron nitride fluorescent material, the boron nitride fluorescent material according to the present invention can efficiently emit light having various light emission spectra.

As shown in FIG. 8, the relative light emission energy in a temperature range of 25° C. (room temperature) to 150° C. of the boron nitride fluorescent material in Example 1 was higher than that of the orthosilicate-based fluorescent material, which meant that the temperature characteristics of the boron nitride fluorescent material in Example 1 was excellent.

The boron nitride fluorescent material according to the present invention can be utilized for a light emitting device for lighting system or projector, which uses an LED or an LD as an excitation light source.

The invention claimed is:

1. A boron nitride fluorescent material, comprising:
   a composition represented by the following formula (I):

$$A_3B_2N_4:M1_x \qquad (I),$$

wherein the element A comprises Ca, M1 represents at least one element selected from the group consisting of Tb, Mn, and Yb, and x is a number satisfying $0 \leq x \leq 0.10$,
   wherein the boron nitride fluorescent material has at least one light emission peak wavelength in a range of 480 nm or more and less than 550 nm as excited with light having a light emission peak wavelength in a range of 250 nm or more and 460 nm or less.

2. The boron nitride fluorescent material according to claim 1,
   wherein in the formula (I), x is a number satisfying $0 \leq x \leq 0.03$.

3. A light emitting device, comprising the boron nitride fluorescent material according to claim 1, and an excitation light source.

4. The light emitting device according to claim 3, wherein the excitation light source is a light emitting diode or a semiconductor laser.

5. A method for producing a boron nitride fluorescent material, comprising:
   preparing a mixture containing a hydride or a nitride containing at least one element A comprises Ca, a boron nitride, and optionally a compound containing at least one element M1 selected from the group consisting of Tb, Mn, and Yb; and
   subjecting the mixture to a heat treatment under a pressure of 10 atmospheric pressures or less,
   wherein the boron nitride fluorescent material comprises a composition represented by the following formula (I):

$$A_3B_2N_4:M1_x \qquad (I),$$

wherein the element A comprises Ca, M1 represents at least one element selected from the group consisting of Tb, Mn, and Yb, and x is a number satisfying $0 \leq x \leq 0.10$, and
   wherein the boron nitride fluorescent material has at least one light emission peak wavelength in a range of 480 nm or more and less than 550 nm as excited with light having a light emission peak wavelength in a range of 250 nm or more and 460 nm or less.

6. The method for producing a boron nitride fluorescent material according to claim 5, wherein the atmosphere in the heat treatment is an inert atmosphere or a reducing atmosphere.

7. The method for producing a boron nitride fluorescent material according to claim 5, wherein the temperature in the heat treatment falls within a range of 1,200° C. or more and 1,600° C. or less.

* * * * *